United States Patent [19]

Riederer et al.

[11] Patent Number: 4,634,979
[45] Date of Patent: Jan. 6, 1987

[54] AUTOMATED NUCLEAR MAGNETIC RESONANCE IMAGE SYNTHESIS

[75] Inventors: Stephen J. Riederer; James N. Lee, both of Durham, N.C.

[73] Assignee: Duke University, Durham, N.C.

[21] Appl. No.: 727,674

[22] Filed: Apr. 26, 1985

Related U.S. Application Data

[63] Continuation-in-part of Ser. No. 550,198, Nov. 9, 1983, Pat. No. 4,573,014.

[51] Int. Cl.⁴ .............................................. G01R 33/20
[52] U.S. Cl. ...................................... 324/307; 324/312
[58] Field of Search ............... 324/300, 307, 309, 312; 364/414; 378/99

[56] References Cited

U.S. PATENT DOCUMENTS 4,573,014 2/1986 Riederer .............................. 324/307

OTHER PUBLICATIONS

Baines et al., "An Improved Picture Display for NMR Imaging", Journal of Physics E: Scientific Instruments, vol. 9, 1976.

Wehrli et al., "The Dependence of Nuclear Magnetic Resonance (NMR) Image Contrast on Intrinsic and Operator-Selectable Parameters", presented at meeting of SPIE, Medicine XII, vol. 419, Apr. 1983.

Primary Examiner—Stewart J. Levy
Assistant Examiner—Kevin D. O'Shea
Attorney, Agent, or Firm—Oblon, Fisher, Spivak, McClelland, & Maier

[57] ABSTRACT

Intrinsic parameters $T_1$, $T_2$ and $M_o$ of the materials in a body under NMR examination are determined by conducting a small number of actual NMR measurements and analyzing the derived data, the measurements being made at different repetition and delay times. The intrinsic parameters are then used to synthesize images which simulate those which would have been generated using other delay and repetition times in an actual measurement process. A processing apparatus is disclosed which operates in real time, permitting an operator to interactively modify the delay and repetition times while observing successive displays which simulates measurements made using those times.

6 Claims, 8 Drawing Figures

AUTOMATED NUCLEAR MAGNETIC RESONANCE IMAGE SYNTHESIS

CROSS REFERENCE TO RELATED APPLICATION

This is a continuation-in-part of application Ser. No. 550,198 filed Nov. 9, 1983, U.S. Pat. No. 4,573,014.

BACKGROUND OF THE INVENTION

1. Field of the Invention

This invention generally relates to an apparatus and a method for producing images of the interior of a body, such as a human body, using data derived from NMR measurement techniques, and more particularly to an improved apparatus and method for producing synthesized computed images based on a minimal number of NMR measurements.

2. Description of the Prior Art

The phenomenon of nuclear magnetic resonance (NMR) has been utilized in recent years to produce images of the interior portions of the body, particularly human bodies, for diagnostic and other purposes. Although primarily used for examination of the interior of a body or body portion having a variety of relatively soft tissues, NMR techniques can also be utilized under other widely varying circumstances. NMR images are utilized to portray characteristics of tissues under inspection which cannot be readily obtained using radiographic techniques and other imaging methods.

A fundamental description of basic NMR physics and imaging techniques is found in Kaufmann et al, Nuclear Magnetic Resonance Imaging in Medicine, Igaku-Shoin Medical Publishers, Incorporated, New York and Tokyo (1981). The important features of the NMR technique which are commonly used in previous methods will now be elaborated upon.

The body under examination is subjected to one magnetic field which is usually constant in magnitude and another field which lies along at least one different vector from the first magnetic field. This second magnetic field is usually time-varying with the exact characteristics of each of these fields being a function of choice between any one of several available imaging techniques. During NMR examinations, the characteristics of the field energy must be preselected. For example in one technique called spin-echo imaging, the repetition time $T_R$, which is defined as the time between successive applications of the same pulse sequence, and the sampling delay time $\tau$ (TAU), must be pre-selected. The first and second fields are applied to the tissue being examined in accordance with selected times and the results are detected and stored with the levels of the storage signals being correlated with their physical positions and with these levels being represented by a matrix of numbers. The numbers of the matrix are then displayed as a matrix of points or pixels which have different light or dark levels and the composite of these pixels forms an image having various contrasting areas.

A physician utilizes the results of these contrasting areas within the image to observe and analyze a "slice" of the body of which the image was made from and, in a medical context, to thereby form a diagnosis. The degree of contrast between the various areas is a function of $T_R$ and $\tau$ values which are selected before the measurement is made and also the intrinsic properties of the materials including net magnetization $M_o$ (which is proportional to Proton density), and the relaxation times $T_1$ and $T_2$. It must be noted that one particular set of values for $T_R$ and $\tau$, will only produce an image with excellent contrast between certain sets of materials but this contrast will be insufficient between other materials being used. The result of this varying contrast depending upon the materials provides for the necessity of making numerous sets of measurements with various values for $T_R$ and $\tau$. The images which result from these measurements using these different values of $T_R$ and $\tau$ are used in order to adequately examine various tissues involved.

This is a time consuming process in which the patient is often subjected to discomfort and, additionally, is repeatedly subjected to the effects of a strong, unit directional magnetic field. For certain measurements, body movement must be prevented during each measurement and the duration of each measurement may last in the order of seconds or minutes, depending upon the pulse sequence technique being utilized and the materials under observation. These conditions establish rather severe limitations on the length of time which can be taken for such measurements and therefore, the number of measurements which can be made. Furthermore, it is not always possible for the examining physician to recognize in advance or even at that particular time, which materials are most significant in the images.

Additional background information and disclosure of devices and techniques in the field to which this invention relates can be found in the following articles and U.S. Patents.

Wehrli, F. W., J. R. MacFall, and G. H. Glover. The dependence of nuclear magnetic resonance (NMR) image contrast on intrinsic and operator-selectable parameters. Presented at the meeting of the SPIE, Medicine XII, volume 419, April, 1983.

Young, I. R. et al. Contrast in NMR Imaging. Presented at the Society of Magnetic Resonance in Medicine, August 1983.

Ortendahl D. et al Calculated NMR images. Presented at the Society of Magnetic Resonance in Medicine, August 1983.

Davis, P. L., et al. Optimal spin-echo images for liver lesions by retrospective calculations. Presented at the Society of Magnetic Resonance in Medicine, August 1983.

| U.S. PAT. NO. | INVENTOR |
|---|---|
| 3,789,832 | Damadian |
| 4,045,723 | Ernst |
| 4,284,948 | Young |
| 4,292,977 | Krause et al |
| 4,297,637 | Crooks et al |
| 4,307,343 | Likes |
| 4,318,043 | Crooks et al |
| 4,354,499 | Damadian |
| 4,355,282 | Young et al |
| 4,390,840 | Ganssen et al |

SUMMARY OF THE INVENTION

Accordingly, an object of the present invention is to provide a method in which a minimal number of measurements are made and in which the data derived from these measurements is used to form synthetic images which include tissue contrasts of a type which would have been produced by measurements made with selected parameters such as $T_R$ and $\tau$ values other than those which were actually used for the measurements.

A further object is to provide an apparatus which is capable of obtaining intrinsic parameters of the body materials under examination and forming synthetic images based on those intrinsic parameters to permit the synthesis of images formed on the basis of other selectable parameters.

Yet another object is to provide a system in which an individual can interactively modify one or both of the selectable parameters repeatedly to produce images having various contrast characteristics until an image having optimum contrast characteristics between desired materials is formed.

Yet another object is to provide a technique in which the variable values are selectable and images producable substantially immediately, on a real-time basis, thereby permitting feedback and repetitive imaging after only a few actual measurements on the body being examined.

Briefly, these and other objects of the invention are achieved by a method of forming computed images of materials within a body based on measurements of NMR characteristics of the body comprising the steps of selecting a set of values for at least one parameter including either pulse-delay $\tau$ or repetition time $T_R$, or both, to be used in a small number of NMR measurements and making the measurements using those selected parameters in a predetermined NMR pulse sequence while collecting the data from which images of the body materials can be formed. Selected intrinsic parameters of the body materials are then calculated from the collected data for each point in a matrix of points in the body, the intrinsic parameter including one or more of spin-lattice relaxation time $T_1$, spin-spin relaxation time $T_2$ and net magnetization or proton density $M_O$. Then, for each point in the matrix a signal is computed, the signal being representative of a brightness based on the intrinsic parameters and an arbitrarily chosen set of selectable parameters, thereby forming a matrix of brightness signal levels from which an image can be synthesized and displayed.

After calculation of the intrinsic parameters, the step of computing can be repetitively performed and images based thereon successively synthesized and displayed, using arbitrary sets of values and observing the results on a real-time basis.

In another aspect, the invention comprises a video processor for synthesizing and displaying images derived from NMR measurements of a body comprising means for performing NMR measurements on the body using a predetermined pulse sequence, control means for selectively establishing parameters controlling the characteristics of the pulse sequence including at least one of pulse-delay time $\tau$ and repetition time $T_R$ and means for storing data from the measurements. The apparatus further comprises means for calculating from the data the intrinsic parameters for each of a matrix of pixels representative of points in the body, the parameters including at least one of spin-lattice relaxation time $T_1$, spin-spin relaxation time $T_2$ and net magnetization $M_o$, and for storing the parameters, and means for computing and storing a value for each pixel in the matrix representative of a brightness level, each such value being derived from the intrinsic parameter values for the point, a selected pulse sequence relationship and selected parameters $T_R$ and $\tau$, thereby forming a matrix representing a displayable image, and means for displaying that image.

It is also an object of the present invention to provide an apparatus whereby image synthesis computations can be performed by general purpose digital video image processors whereby a plurality of video frames are used to model the mathematical equation descriptive of NMR signal behavior such that each term of the descriptive equation is consecutively computed and stored in one of the plurality of frames.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DESCRIPTION OF THE PREFERRED EMBODIMENTS

As previously mentioned, and as is well understood in the art, the brightness or lightness of signals observed in an NMR image depend upon the characteristics of the tissue being examined, these characteristics being described as intrinsic parameters of the tissue and including hydrogen or proton density, which is also described as the degree of magnetization $M_o$; a first delay $T_1$ which is defined as the spin-lattice relaxation time because of the energy interchange phenomenon which occurs between the spin and the lattice in which the molecule resides; and a second interval $T_2$ which is defined as the spin-spin relaxation time for analogous reasons. For nonstationary substances, there is also a vector flow velocity characteristic, but this characteristic will be largely ignored herein. These intrinsic parameters of the body under investigation, as will be recognized, differ from one tissue type to another as to hydrogen or proton density as well as the relaxation times, fatty tissues, for example, being much higher in hydrogen density than the lungs or than air itself. These intrinsic parameters, however, can have a greater or smaller effect on the intensity of the detected signal, depending upon the relative amplitudes of the selectable parameters $T_R$ and $\tau$. Various NMR pulse sequences can be used to analyze material, such as inversion recovery, spin-echo or partial saturation. The relationship between signal strength and these fixed and intrinsic parameters are rather well understood such that, for any two materials having different and known relaxation time values, one or both of the parameters $T_R$ and $\tau$ can be selected in advance so as to maximize the difference in intensity signals between them, providing optimum contrast.

Figure 1:
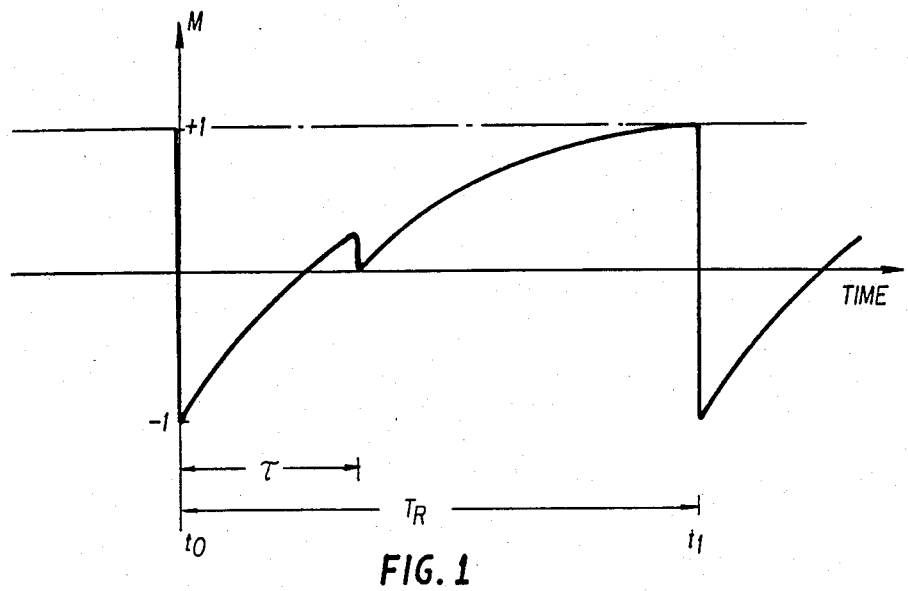
FIG. 1 is a graphical representation of characteristics of one pulse sequence measurement cycle for purposes of defining terms.

FIG. 1 is an illustration of a typical magnetization characteristic in an inversion recovery pulse sequence which begins at time $t_o$ with a reversal of normalized longitudinal magnetization from a $+1$ to $-1$ value. Immediately after this flip, the magnetization of the material begins to return toward the original value and, if uninterrupted, returns to the original value in an interval of time which can be measured in milliseconds or seconds, depending upon the material and other factors. In the example illustrated, a measurement is made after a delay interval $\tau$, causing a momentary reversal in the magnetization from which the magnetization again begins to return to its original state.

A new sequence is initiated after a repetition time $T_R$, starting a new cycle at time $t_1$. As will be recognized, the values of $\tau$ and $T_R$ can be selected by the system operator and these will have an impact on the contrast brightness.

For spin-echo imaging, the brightness S is proportional to an exponential function of the intrinsic and selectable parameters, as follows:

$$S \propto M_o\{1 - 2e^{-(T_R-\tau)/T_1} + e^{-T_R/T_1}\}e^{-2\tau/T_2}$$

wherein $M_o$ is the net magnetization at equilibrium.

In the following discussion, spin-echo imaging will be used as the example because it involves both $T_1$ and $T_2$. The technique is, however, useful with other NMR imaging signal systems such as a modified spin-echo sequence in which $$S \propto M_o\{1 - e^{-T_R/T_1}\}e^{-2\tau/T_2}$$

where $T_R >> \tau$;
an inversion recovery (IR) sequence in which $$S \propto M_o\{1 - 2e^{-\tau/T_1} + e^{-T_R/T_1}\};$$

or a partial saturation (PS) sequence in which $$S \propto M_o\{1 - e^{-T_R/T_1}\}.$$

It will be observed that in the spin echo and IR relationship both $T_R$ and $\tau$ are available for operator control but in PS only $T_R$ is controllable.

The present invention is based in part on the recognition of the fact that measurements made for several different delay times and repetition times result in data which permits the calculation of the intrinsic parameters $M_o$, $T_1$ and $T_2$ for the tissues in the sample under observation and thus supplies sufficient data to permit synthesis of other images.

In the performance of the method, measurements are first made using several different delay times $T_m$ and repetition times $T_n$. Then, from the data gathered from these measurements, $T_1$ and $T_2$ are determined once and for all for all points in the image. In other words, the fundamental relaxation times of the materials themselves do not change as a function of the input signal characteristics. Thus, it is possible, using the example of spin-echo imaging, to employ the values of $M_o$, $T_1$ and $T_2$ in the first expression given above along with a variety of selected values of $T_R$ and $\tau$ to produce mathematically generated NMR images which present the appearance of images made as a result of tests with other $T_R$ and $\tau$ values, even though those values were never actually used in the pulse sequence. With a limited number of measurements, images for a variety of other arbitrary pulse sequences and selectable parameters can be formed. It is necessary only to construct hardware which implements the brightness relationships given above, or the appropriate one of these relationships, or a relationship characteristic of another mode of NMR imaging, and insert the desired values. Alternatively, a computer can be programmed to accept such data and perform the necessary operations. As will be recognized, the specific relationships for S set forth herein are neither novel nor critical to the operation of the invention. Rather, it is only necessary to employ the known relationship which is appropriate to the NMR pulse sequence being employed.

If the operator selects the value of $T_R$ and $\tau$ which were used in one of the actual tests, the resulting synthesized image would match or be very close to the original image obtained.

Figure 2:
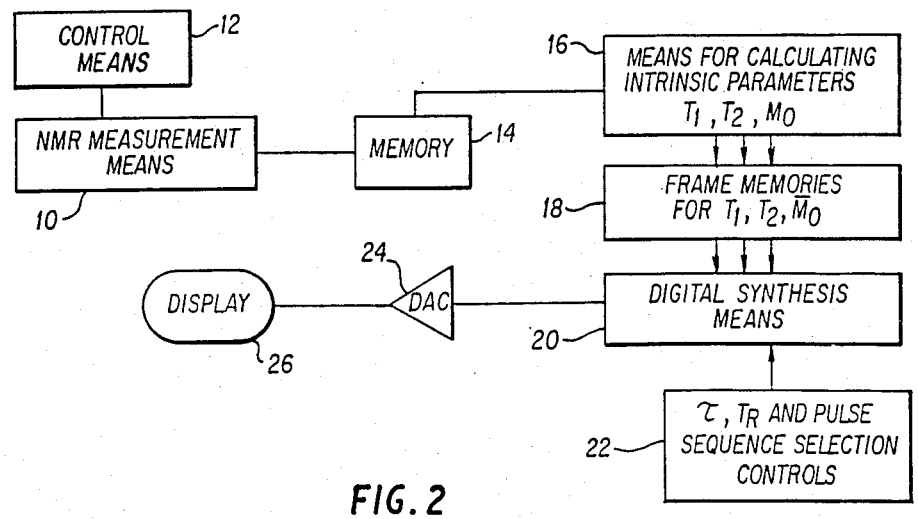
FIG. 2 is a schematic block diagram of an apparatus for performing the overall method of the invention.

An apparatus for accomplishing the above is illustrated in block diagram form in FIG. 2 wherein an NMR measurement apparatus 10 is under the control of a conventional control means 12 by which the various operations of the system can be controlled in a well-known fashion. The measurement and control means 10, 12 can be in accordance with the previously discussed prior art or in accordance with the Kaufmann et al text, the important feature for present purposes being that the control means must permit the selection of delay and repetition times.

The results of several measurements, perhaps three or four, are stored in a memory 14. This data is then subjected to processing by which the intrinsic parameters of the body materials examined by the NMR measurements are calculated, this being illustrated as accomplished by a processor 16 which can be a suitable minicomputer programmed to calculate $M_o$, $T_1$ and $T_2$. An example of results obtained by such calculation are presented in Wehrli et al, "Parameters Determining the Appearance of NMR Images", *Modern Neuroradiology: Advanced Imaging* Techniques Eds. T. H. Newton and D. G. Potts 5 (San Anselmo: Clavadel Press), 1983, pp. 81-118. If the measurements themselves are initially made using a reasonable spread of delay time and repetition times, the intrinsic parameters can be readily calculated and stored in frame memories 18 which can, for example, be part of a Gould/DeAnza IP 8400, a commercially available image processor which is readily adaptable for use in the apparatus of FIG. 2.

For purposes of synthesizing images using the originally employed selectable parameters as well as others, the intrinsic parameter values are supplied to a digital synthesis means 20 which is coupled to an interactive control 22 which permits the selection of $\tau$, $T_R$ and the form of NMR pulse sequence. The synthesis means forms a frame of pixels based on the stored intrinsic parameters and the selected selectable parameters and supplies these to a digital to analog converter 24 which supplies them, with suitable level management, to a conventional monitor 26 for display.

Figure 3:
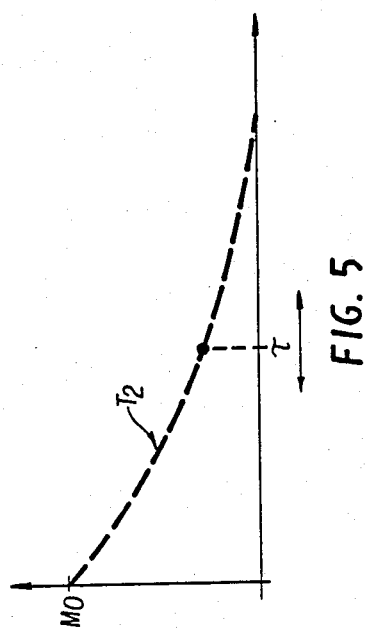
FIG. 3 is a schematic block diagram showing in greater detail a portion of the system of FIG. 2.

As shown in FIG. 3, the image processor includes three separate frame memories which allow each of the parameters $M_o$ $T_1$ and $T_2$ to be represented in a complete frame memory and interactive adjustment of more than one operator-selectable parameter is allowed. The intrinsic parameters are functions of position in the body and are similarly represented in the frame memories. As is conventional in imaging techniques, the values for each voxel of material are addressed in accordance with x and y values, the addressing technique being appropriate to the processing system used. The values from the frame memories are provided to digital synthesis circuitry 20. The selection controls 22 can be coupled to a microprocessor 30 which is advantageously part of the apparatus having the frame memories for which the Gould/DeAnza IP 8400 was previously suggested. This enhances the compatibility of these portions of the system.

Figure 4:
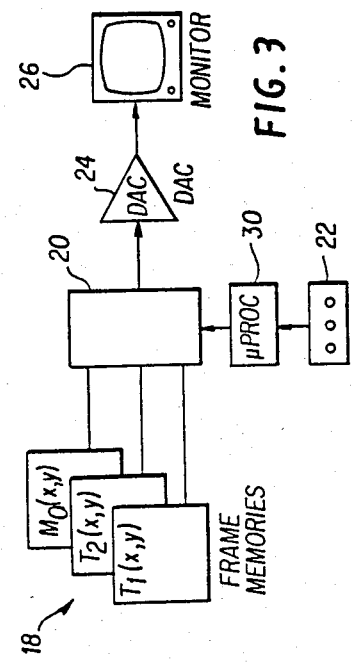
FIG. 4 is a schematic block diagram showing in greater detail a portion of the system of FIG. 3.

The digital synthesis circuitry is shown in greater detail in FIG. 4 which includes lookup tables 32, 33, 34 and 35. As will be recognized by those skilled in the art, the lookup tables are digital memory devices which have a predetermined number of address inputs and outputs. By suitably loading the contents of each address in the table, the device can be provided with its own distinctive transfer function. Thus, each lookup table can perform the task of a function generator. Thus, the contents of address m are loaded with the function f(m). When m is input to the lookup table, f(m) is read out. As shown in FIG. 4, $T_1$ is input to tables 32 and 33 and functions of $T_1$ can be read out of those tables.

For example, considering the middle term of the expression for signal intensity in an inversion recovery pulse sequence, this is an exponential function of the ratio of $-\tau:T_1$. When the operator uses the interactive controls 22 to establish a new value of $\tau$, microprocessor 30 simply goes through all permissable values of $T_1$ and generates the exponential function for each, using the new $\tau$ value. When this is completed, the new transfer function is loaded into lookup table 32 using standard circuitry which has been omitted for the sake of clarity. Similar functions are establishable in the other tables, depending upon the pulse sequence being employed.

The outputs of tables 32 and 33 are delivered to an arithmetic logic unit 37 which is connected to a data bus 40 to which the outputs of tables 34 and 35 are also connected. The bus is coupled to the inputs of arithmetic logic units 42, 43 and 44 in such a way that the outputs from ALU 37, table 34 or table 35 or the output of a constant factor generator 46 can be selected in pairs by any one of ALU 42, 43, or 44. Thus, any of the functions are available to the arithmetic units which can then perform addition, subtraction, simple transfer, inversion, zero output, or alternate functions. Again, the functions of these conventional arithmetic units is chosen to be consistent with the expression appropriate to the pulse sequence selected.

The outputs of ALUs 42 and 43 are connected to a conventional multiplier 48, the output of which is connected to an input of a multiplier 49 along with the output of ALU 44. The output of multiplier 49 is connected to the digital-analog converter 24, and hence to the monitor. As is well known, the multiplier circuits receive two digital inputs and generate their product.

It should be understood that the processor is designed to operate at real time video rates. This means that all calculations required to generate a single synthesized image are done in 1/30 second video frame time. This is accomplished by first reading out in parallel from the three frame memories $T_1$, $M_o$ and $T_2$ as a function of x and y the pixel in the upper left hand corner, i.e., $T_1$ (1,1), $T_2$ (1,1), and $M_o$ (1,1). These values are input to tables 32–35 and approximately one microsecond later the synthesized signal for pixel (1,1) is fed to DAC 24. While this is going on, values at pixels (2,1), (3,1), etc. are read out from the three frame memories, typically at 100 nanosecond intervals and delivered to tables 32–35, one after the other. After the first line is completely read out, the pixels from the next line are read out and this sequence continues through the entire memory.

As will be recognized, registers for pulse synchronization, clock and address generators, power supplies and the like have been omitted as being conventional and not forming a direct part of the present invention, although such equipment is obviously necessary for operation of equipment of this type.

The manner in which this operation is performed with one of the pulse sequences can be understood by referring to the expression for spin-echo imaging which will be seen to have five terms. Two of these terms involve exponentials in which the exponent includes $T_1$. Thus, $T_1$ is fed, pixel by pixel, to tables 32 and 33, the outputs of which become the third and fourth terms, respectively, of the expression. The fifth term, which is a function of $T_2$, is generated in table 34. The third and fourth terms are then algebraically combined in arithmetic logic unit 37 and furnished to bus 40. The quantity within the brackets is the output of ALU 42 and the product of this result along with the first and fifth terms is performed by multipliers 48 and 49. The other pulse sequences are accommodated simply by controlling the contents of the various tables or the functionality of the arithmetic logic unit and multipliers.

It should be stressed that all components used can be operated at frequencies as high as 10 mega Hertz or more, compatible with 512×512, 30 Hertz video imaging. Thus, whenever the operator alters a selectable parameter, the processor immediately calculates the new exponential transfer function and loads it immediately into the relevant lookup tables. This means that new values and an entire new contrast presentation can be generated with each successive frame of the monitor system, permitting the operator to try values of $\tau$, TR until the area in which he is most interested exhibits optimum contrast. He can further randomly insert these values so that areas which may not have been recognized as significant become more clearly visible due to improved contrast, permitting a form of examination, without multiple measurements and without the constraints imposed by the presence of the patient and large, complicated equipment for much improved examination and diagnostic capabilities.

Figure 5:
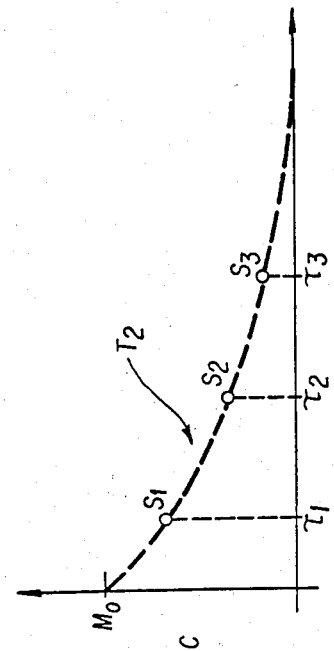
FIGS. 5 and 6 are graphical representations of the variation of an intrinsic parameter, illustrating the functions of selection of a selectable parameter.

FIG. 5 shows a graph of the variation of detected signal for a material having specified $M_O$ and $T_2$ values as a function of $\tau$, illustrating that variations in $\tau$ affect the detected signal in a nonlinear fashion. Varying $\tau$ can thus permit synthesis of alternate images having more desirable characteristics for special purposes.

Figure 6:
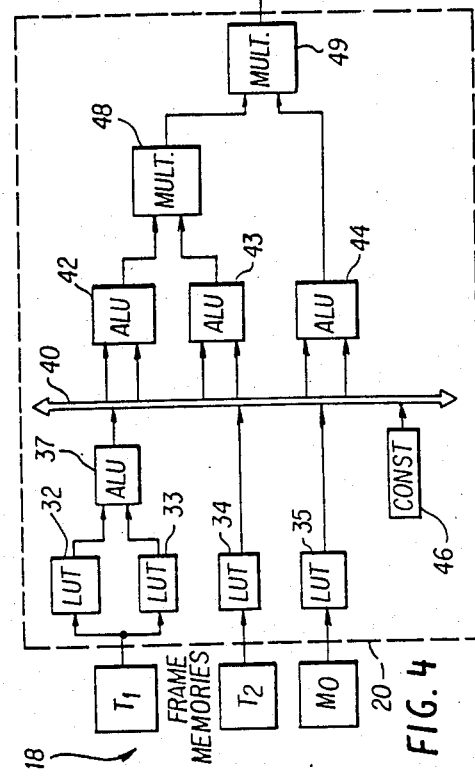

A similar relationship is shown in FIG. 6 wherein signal levels $S_1$, $S_2$ and $S_3$ are related to selected values of $\tau:T_2$.

The system disclosed herein can also be used to apply some enhancement techniques in which the transfer functions applied to the LUT's are weighted to affect the computed values differently, thereby altering or enhancing the image.

Figure 7:
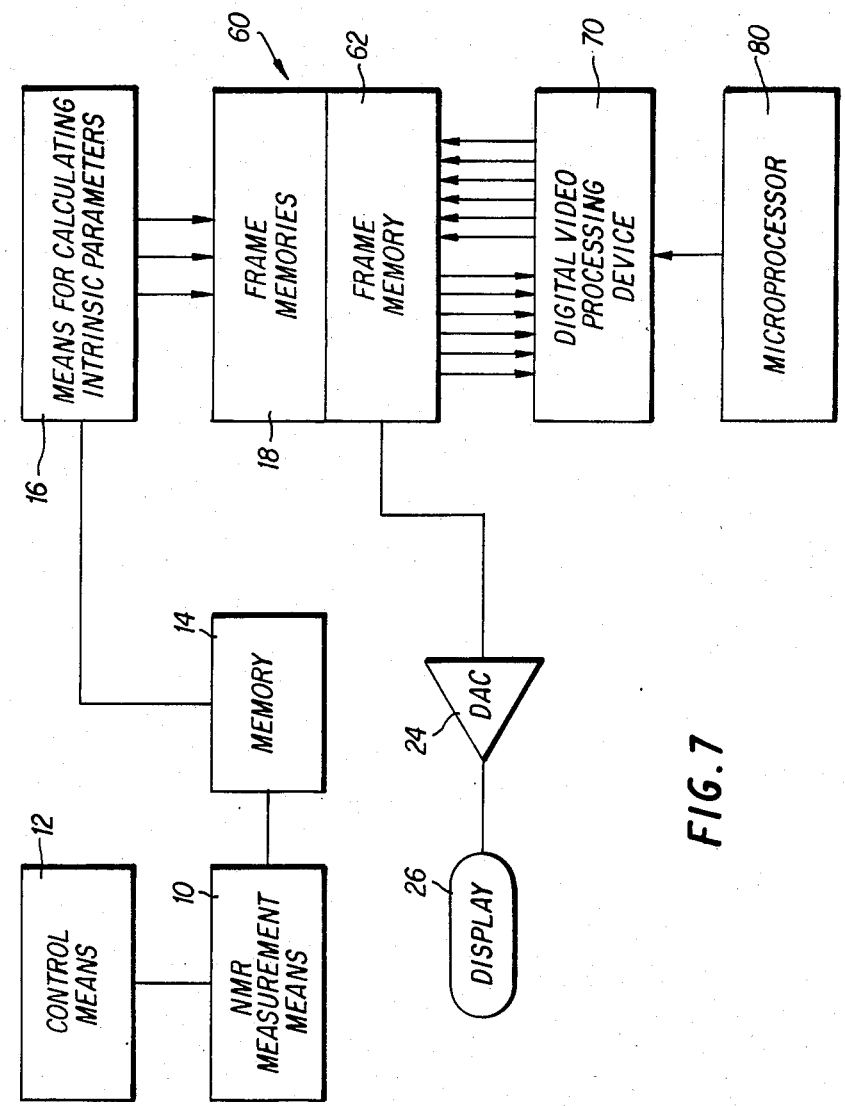
FIG. 7 is a schematic block diagram of an alternate embodiment of the apparatus for performing the overall method of the invention.
Figure 8:
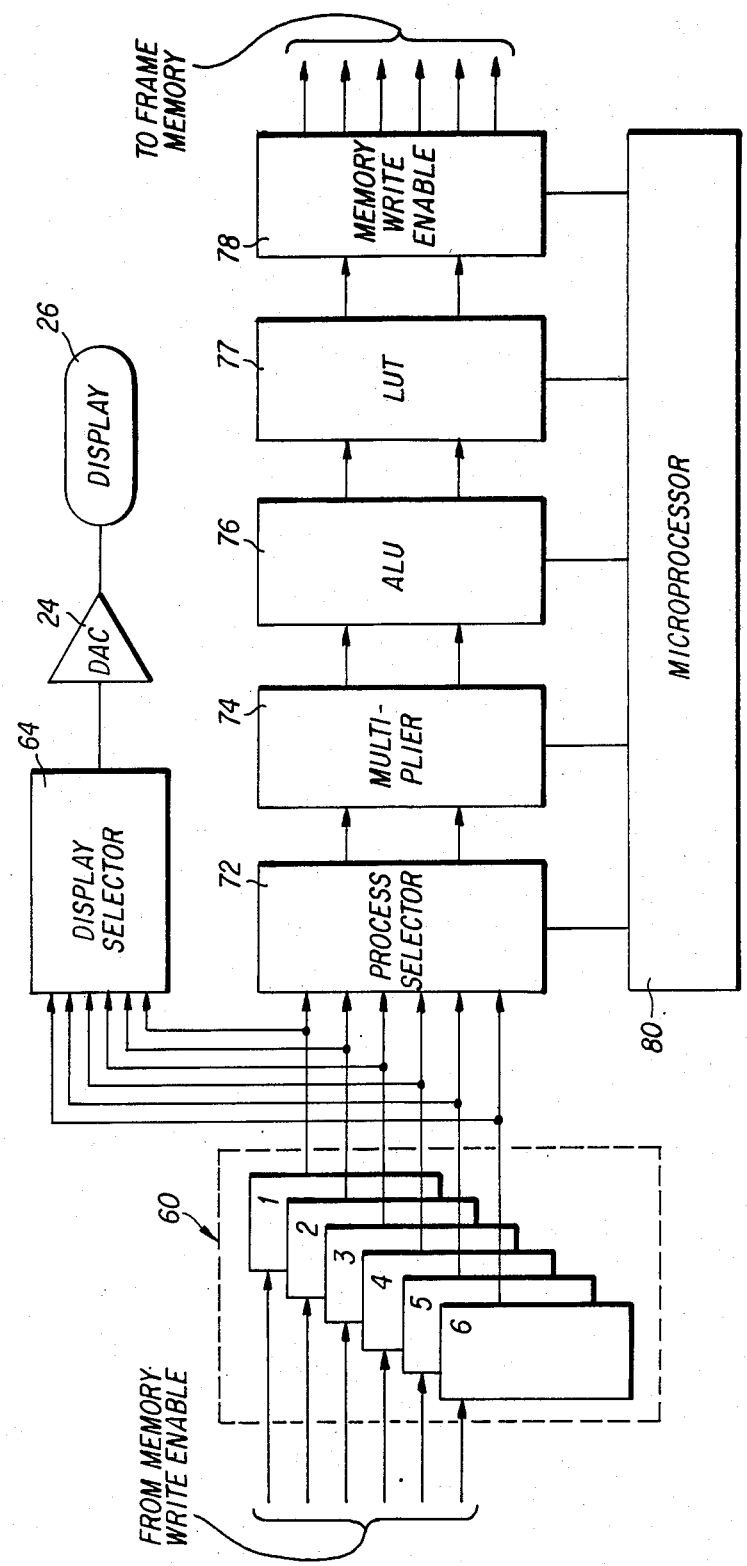
FIG. 8 is a schematic block diagram showing in greater detail a portion of the system of FIG. 7.

The FIGS. 7 and 8 present an alternate embodiment of image synthesis. Whereas, in the instance of the FIG. 2 embodiment, a circuit was constructed which is capable of modeling the mathematical equation descriptive of NMR signal behavior for all pixels in an image within a 1/30 second video frame interval, the network of required components for the embodiments of the FIGS.

2-4 would have to be custom made for a specific project of NMR image synthesis. The FIGS. 7 and 8 present an alternate approach to the generation of the signal S for a characteristic equation of the type of pulse sequence being used. That is, for a spin-echo pulse sequence, which is the most comprehensive equation to be solved;

$$S = M_o[1 - 2\exp(-(T_R-\tau)/T_1) + \exp(-T_R/T_1)]\exp(-2\tau/T_2)$$

Although, as has been previously described the embodiment of FIG. 2 adequately functions with a pixel rate typically of about 10 MHz, consistent with a 30 Hz video frame rate of 512×512 pixel images, as have been previously mentioned the required components of the digital synthesis means 20 must be custom made. The FIGS. 7 and 8 describe an embodiment whose object is to utilize a general purpose digital video image processor to be applied to the above equation. Although no commercial digital video processing device is capable of performing the complete equation within one video frame, many such devices are able to generate the individual terms of the equation. That is, an image of $T_1$ can be converted into an image of $\exp(-T_R/T_1)$ and stored in one frame and the same $T_1$ image can be converted into $2\exp(-(T_R-\tau)/T_1)$ and stored during a second frame with the second results subtracted from the first in a third video frame, etc. In this manner each term of the characteristic equation for the signal S (brightness) for a spin-echo pulse sequence can be generated during a video frame and added or multiplied to the running total until the entire signal S is built up.

The FIG. 7 is a block diagram wherein the devices utilized in the FIG. 2 embodiment have retained their same number. It can be seen that the frame memory construction 60 of FIG. 7 utilizes the same frame memories 18 for the intrinsic parameters $T_1$, $T_2$ and $M_o$ as in FIG. 2, however the frame memory 60 includes the additional frame memories 62 whose use will be explained later and whose number depends upon the particular type of imaging used. The digital video processor 70 functions to both receive information and to communicate with each of the memories of the frame memory 60 including original frame memories 18 and the additional frame memory 62, utilized for the computation purposes of the particular characteristic equation. The digital video processor 70 is controlled by a microprocessor 80 and the inter-relationship between the digital video processor 70, the microprocessor 80 and the frame memory 60 is shown in FIG. 8 in detail. This microprocessor 80 takes the place of microprocessor 30 of FIG. 3.

The FIG. 8 details a structure of the frame memory 60 and the digital video processor 70 as well as interaction with the microprocessor 80 and the output to the display 26. For purposes of illustrating the solving of the equation concerning a spin-echo imaging technique, a total of six frame memories have been illustrated with the frames 1, 2 and 3 containing, for example, the intrinsic parameters $T_1$, $T_2$ and $M_o$ from the calculating means 16. The output of each of the frames 1-6 hereinafter referred to as F1-F6 is fed to the digital video processor which consists of the subprocessor selector 72, the multiplier 74, the arithmetic logic unit (ALU) 76, the lookup table (LUT) 77 and the memory write/enable 78. Each of these units 72, 74, 76, 77 and 78 are controlled by the microprocessor 80 in a manner to be detailed below.

For purposes of ease of illustration, the characteristic equation described above, for the spin-echo image pulse sequence, will be divided in the following terms:
Term 1 = $M_o$
Term 2 = 1
Term 3 = $-2\exp(-(T_R-\tau)/T_1)$
Term 4 = $\exp(-T_R/T_1)$
Term 5 = $\exp(-2\tau/T_2)$ Prior to describing the sequence of manipulations accomplished by the digital video processor with respect to generating the characteristic equation on a frame by frame basis, it should be noted that the microprocessor 80 controls the processor selector 72 to select which ones of the six inputs from the six frames are to be utilized in a particular term calculation. If the operation utilizes a multiplying factor then the microprocessor directs the multiplier 74 to perform an operation based upon the two inputs fed to the multiplier after having been selected by the selector 72. When a multiplication operation is to be performed the arithmetic logic unit is simply directed to pass through the signals from the multiplier. If an exponential factor is to be generated, this is performed by the LUT (lookup table) 77. If on the other hand the term which is being calculated does not use an exponential factor once again the microprocessor only directs the LUT 77 to pass through the output to the memory write/enable which in turn outputs on a specific line the calculated value to particular ones of the frame memories F1-F6. This will become more clear when taken in conjunction with the following description of a sequence of activities in order to generate the characteristic spin-echo image pulse sequence. This sequence will be discussed on a frame time interval basis.

During a first time interval A, term number 3 is generated or calculated and fed through to the frame member F4. It is once again noted that the frames F1-F3 contain the terms $M_o$, $T_1$, and $T_2$ so that in the generation during the first time interval the lookup table 77 generates the entire term including the exponential function and coefficient (2) whereas the arithmetic logic unit 76 and the multiplier 74 merely pass on the signal until it reaches the lookup table 77 wherein the exponential function is generated and output through the memory write/enable 78 which passes on to the input of the memory frame F4 the calculated value.

During a second time frame interval B the terms 2 and 4 are calculated and added together and stored in the frame F5. The generation of this entire term can be performed in the LUT 77, the signals from the T1 image passing unaltered through the ALU 76 and multiplier 74.

During a third frame interval C the contents of frame F4 and the contents of frame F5 are added together and stored in the frame F4. This is equivalent to adding together the terms 2, 3 and 4, however, because these terms were previously generated by the lookup tables in frame interval A and frame interval B, the only function needed to be accomplished through this particular pass through of the digital video processor is the use of the ALU 76 which adds together the selected frames F4 and F5 and passes through the memory write/enable 78 the output which is now stored in the frame F4.

During a fourth time frame interval D the term 5 is calculated and stored in the memory frame F5. This is possible because the information previously stored in the frame F5 is no longer necessary in our sequential term by term calculation of the equation.

In frame interval E the contents of frame F4 and the contents of frame F5 are multiplied together and stored in the frame F5. With this particular pass through of information the only unit utilized by the digital video processor is the multiplier 74. In other words there is no addition or exponential function calculation necessary and thus the ALU 76 and the LUT 77 merely pass through the information output from the multiplier 74.

During the sixth time interval F the term 1 is multiplied by the contents of the memory frame F5 and a new value stored in the frame F6. This is equivalent to multiplying the contents of frame F1 with frame F5 because the term 1 is equal to $M_o$ which is stored in frame F1. This step completes the formation of the synthetic spin-echo images.

Finally, during the seventh time interval G the frame F6 is read out and fed to the display selector 64 and subsequently passed through the digital to analog converter 24 to the display 26 in order to display the results of the calculation of the equation.

Although the display selector 64 has been shown connected to the outputs of all of the frames F1–F6, in practical terms, only the display of the frame F6 is utilized in normal calculations. In general it is converted into a video signal during every time frame interval so the operator sees a continuous display. Its contents are altered, however, only after completion of all computations required to form a new synthetic image for whatever pulse sequence is desired. For purposes of diagnostic testing the display selector 64 could select any one of the frames F1–F6 for display in order to check the interim calculations or to check the locations of the stored values in any of the frames.

Although the sequence of video time intervals has been described in terms of the seven intervals A–G with respect to the sequence of calculations, it is to be noted that, in actuality, some of the time intervals may in fact extend and require two or more time intervals, particularly those which require a modification of the look up table (LUT) 77. That is, although the time frame interval itself may be sufficient for each of the operations, in fact, it is the approximately 2.5 millisecond retrace time, during which certain functions with respect to the lookup table must be accomplished, which causes the possibility of a need for a further time interval. Thus, depending upon the number of times that the lookup table 77 is utilized in the sequence of activities in order to generate the equation, the time frame intervals may extend up to ten or more video frame intervals which would be required to generate the brightness S.

The embodiment of FIGS. 7 and 8 basically exists as a trade off for the rapidity with which synthetic images can be formed versus the degree of complexity required of the digital circuitry. Utilizing "off the shelf" equipment for the circuitry of FIGS. 7 and 8 rather than the custom-made circuitry of the FIG. 2 embodiment results in approximately a ⅓ second image generation time rather than the 1/30 second generation time for the customized circuitry of FIGS. 2–4. Although the embodiment of FIGS. 7 and 8 is 10 times slower, the one-third second is tolerable by most viewers and the trade off with respect to the use of "off the shelf" equipment for the digital video processor makes the embodiment of FIGS. 7 and 8 an attractive alternative to the customized structure of the digital synthesis means 20 of FIGS. 2–4.

The frame interval sequence of activities performed by the video display processor exemplified above with respect to the operation of the FIGS. 7 and 8, is by no means limiting with respect to the order of performance of the various terms of the equation. That is, another sequence of activities by which other terms of the equation are first generated and stored in the various frames F4 and F5 could function equally well depending upon the type of microprocessor used.

Other modifications of the system including the generation of characteristic brightness equations for the other types of NMR pulse sequencing such as inversion recovery (IR) and partial saturation (PS) as well as other mathematical functions are readily available in view of the nature of the exemplified embodiment of FIGS. 7 and 8.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A video processor for synthesizing and displaying images derived from NMR measurements of a body comprising:
    means for performing NMR measurements on a body using a predetermined pulse sequence;
    control means for selectably establishing a first set of parameters controlling the characteristic of the pulse sequence including at least one of pulse delay time $\tau$ and repetition time $T_R$;
    first storage means for storing data from said means for performing measurements;
    means for calculating from said data a plurality of intrinsic parameters for each pixel of a matrix of pixels representative of points in the body, said parameters including at least one of spin-lattice relaxation time $T_1$, spin-spin relaxation time $T_2$ and net magnetization $M_o$;
    second storage means including means for storing said parameters;
    means for computing a value for each pixel in said matrix representative of a brightness level, each said value being derived from the intrinsic parameter values for the point, a selected pulse sequence relationship and selected parameters $T_R$ and $\tau$ said selected parameters possibly being different from said first set of parameters, thereby forming a matrix representing a displayable image, wherein said second storage means further includes a means for storing said computed value for said matrix of pixels which represents said displayable image; and
    means for displaying said image.

2. The apparatus according to claim 1 wherein said second storage means includes a first and second plurality of frame storage members wherein said first plurality of frame storage members stores said intrinsic parameters.

3. The apparatus according to claim 2 wherein said means for computing said value for each pixel includes a means for computing at least a first intermediate value and outputting each said at least first intermediate value to one of said second plurality of frame members; and
    means for calculating at least one second intermediate value and outputting each said at least one second intermediate value to one of said second plurality of frame members.

4. The apparatus according to claim 3 wherein the means for computing said at least first intermediate value receives the output of at least one of said first plurality of frame members and wherein said means for computing one of said second intermediate values has an input for receiving the output of at least one of the outputs of said second plurality of frame members.

5. The apparatus according to claim 4 wherein said means for computing includes a multiplier, a adding means, a lookup table, a selector means and a microprocessor for controlling each of said multiplier, said adding means, said lookup table and said selector means.

6. The apparatus according to claim 5 wherein said display means includes a display selector for selecting the output of one of said second plurality of memory frame members and outputting on a viewing device the contents of said selected frame member.

* * * * *